US009875780B1

(12) United States Patent
DeBrosse

(10) Patent No.: US 9,875,780 B1
(45) Date of Patent: Jan. 23, 2018

(54) STT MRAM SOURCE LINE CONFIGURATION

(71) Applicant: International Business Machines Corporation, Armonk, NY (US)

(72) Inventor: John K. DeBrosse, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/251,564

(22) Filed: Aug. 30, 2016

(51) Int. Cl.
*G11C 11/16* (2006.01)

(52) U.S. Cl.
CPC ...... *G11C 11/1673* (2013.01); *G11C 11/1655* (2013.01); *G11C 11/1657* (2013.01); *G11C 11/1659* (2013.01); *G11C 11/1675* (2013.01)

(58) Field of Classification Search
CPC ...... G11C 11/16; G11C 29/021; G11C 29/028
USPC ...................................................... 365/158
See application file for complete search history.

(56) References Cited

U.S. PATENT DOCUMENTS

| | | | |
|---|---|---|---|
| 6,982,902 B2 | 1/2006 | Gogle et al. | |
| 8,355,272 B2 | 1/2013 | Andre | |
| 8,446,757 B2 | 5/2013 | DeBrosse et al. | |
| 8,681,537 B2 | 3/2014 | Lee | |
| 9,257,165 B2 | 2/2016 | Andre | |
| 9,286,218 B2 | 3/2016 | Andre et al. | |
| 9,343,131 B1 | 5/2016 | DeBrosse | |
| 9,406,873 B2 | 8/2016 | Han et al. | |
| 2004/0004856 A1* | 1/2004 | Sakimura | G11C 11/15 365/158 |
| 2004/0062074 A1* | 4/2004 | Ooishi | G11C 11/15 365/158 |
| 2011/0267874 A1* | 11/2011 | Ryu | G11C 11/16 365/158 |
| 2012/0257445 A1* | 10/2012 | Lee | G11O 5/063 365/158 |
| 2014/0269032 A1* | 9/2014 | Ong | G11C 11/1673 365/158 |
| 2015/0255133 A1 | 9/2015 | Andre | |

(Continued)

OTHER PUBLICATIONS

Kim et al., "A Covalent-Bonded Cross-Coupled Current-Mode Sense Amplifier for STT-MRAM with 1T1MTJ Common Source-Line Structure Array," 2015 IEEE International Solid-State Circuits Conference (ISSCC 2015), pp. 134-136 (Feb. 2015).

(Continued)

*Primary Examiner* — Huan Hoang
*Assistant Examiner* — Minh Dinh
(74) *Attorney, Agent, or Firm* — Vazken Alexanian; Michael J. Chang, LLC

(57) ABSTRACT

Improved STT MRAM source line configurations are provided. In one aspect, a STT MRAM array includes: a plurality of cells including magnetic tunnel junctions in series with field effect transistors; a plurality of word lines perpendicular to a plurality of bit lines; a plurality of source line segments spanning m+1 of the bit lines, wherein m of the bit lines include regular array bit lines, and wherein at least one other of the bit lines includes an extra bit line that is connected to the source line segments such that the source line segments span the regular array bit lines and the extra bit line. An STT MRAM device and a method for operating an STT MRAM device are also provided.

16 Claims, 7 Drawing Sheets

(56) References Cited

U.S. PATENT DOCUMENTS

2015/0371695 A1    12/2015    Roy et al.

OTHER PUBLICATIONS

X. Fong et al., "Embedding Read-Only Memory in Spin-Transfer Torque MRAM-Based On-Chip Caches," IEEE Transactions on Very Large Scale Integration (VLSI) Systems, vol. 24, No. 3, Mar. 2016, pp. 992-1002.
List of IBM Patents or Applications Treated as Related.

* cited by examiner

*FIG.* 7
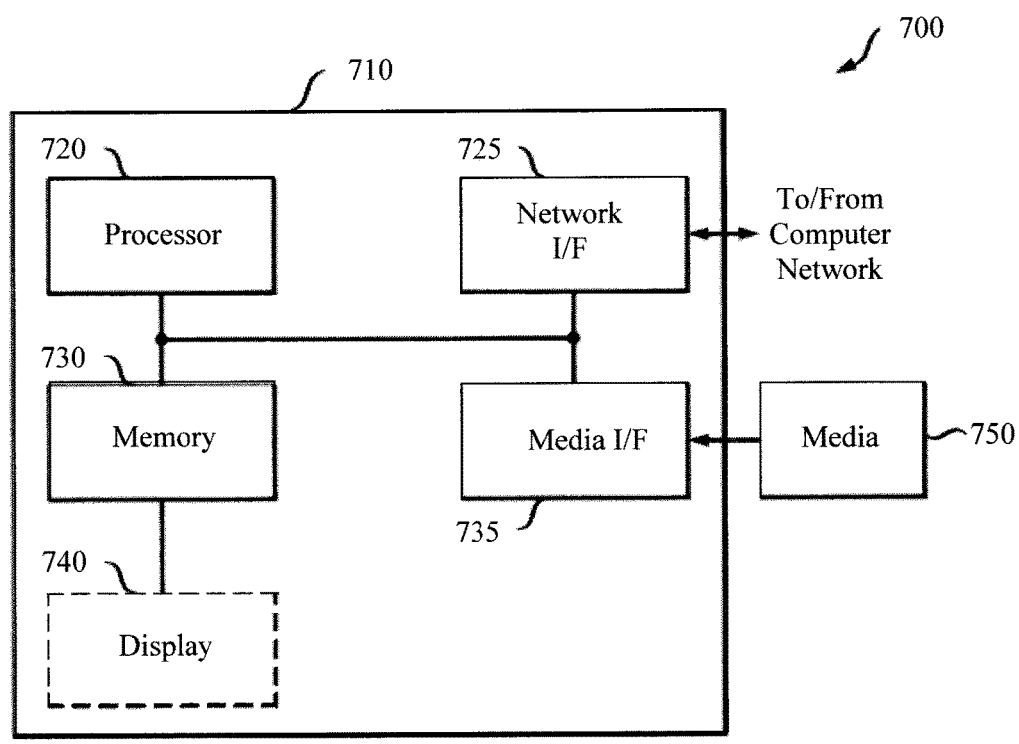

STT MRAM SOURCE LINE CONFIGURATION

FIELD OF THE INVENTION

The present invention relates to Spin Torque Transfer (STT) Magnetoresistive Random Access Memory (MRAM), and more particularly, to improved STT MRAM source line configurations.

BACKGROUND OF THE INVENTION

Spin Torque Transfer (STT) Magnetoresistive Random Access Memory (MRAM) is an attractive emerging memory technology, offering non-volatility, high performance, and high endurance. An STT MRAM memory cell generally includes a Magnetic Tunnel Junction (MTJ) in series with a Field Effect Transistor (FET) which is gated by a Word Line (WL). A Bit Line (BL) is connected to the MTJ and runs perpendicular to the WL. A Source Line (SL) is connected to the FET.

In standby, the WL, BL, and SL are held to ground. One cell along the BL is selected by raising its WL. When a sufficiently large voltage is forced across the cell from BL to SL, the selected MTJ is written to a particular (i.e., parallel or anti-parallel) state. The written state is determined by the polarity of this voltage (BL high versus SL high).

Wiring the SL within an STT MRAM array can present notable challenges. For instance, it is common to have the SL run parallel to the BL. However, to enable contact with the underlying FETs the SL has to be narrow (which undesirably increases resistance) and/or a larger cell is needed. Instead, running the SL perpendicular rather than parallel to the BL (and sharing the SL between adjacent rows) addresses these issues. However, such an arrangement results in some loss of cell selectivity since multiple bits share the same word line and source line. This loss of selectivity must be addressed in the operation of the array.

Accordingly, improved STT MRAM SL configurations would be desirable.

SUMMARY OF THE INVENTION

The present invention provides improved Spin Torque Transfer (STT) Magnetoresistive Random Access Memory (MRAM) source line configurations. In one aspect of the invention, a STT MRAM array is provided. The STT MRAM array includes: a plurality of cells including magnetic tunnel junctions in series with field effect transistors; a plurality of word lines perpendicular to a plurality of bit lines, wherein the field effect transistors are gated by the word lines, and wherein the bit lines are connected to the magnetic tunnel junctions; a plurality of source line segments spanning m+1 of the bit lines include regular array bit lines, and wherein at least one other of the bit lines includes an extra bit line that is connected to the source line segments such that the source line segments span the regular array bit lines and the extra bit line.

In another aspect of the invention, an STT MRAM device is provided. The STT MRAM device includes: a memory cell array having: a plurality of cells having magnetic tunnel junctions in series with field effect transistors; a plurality of word lines perpendicular to a plurality of bit lines, wherein the field effect transistors are gated by the word lines, and wherein the bit lines are connected to the magnetic tunnel junctions; a plurality of source line segments spanning m+1 of the bit lines, wherein m of the bit lines include regular array bit lines, and wherein at least one other of the bit lines includes an extra bit line that is connected to the source line segments such that the source line segments span the regular array bit lines and the extra bit line; a source line driver on one end of the bit lines connected to the extra bit line; and a column decoder on an opposite end of the bit lines from the source line driver. The column decoder can include a source line net to which unselected bit lines are connected; and a master bit line to which a selected bit line is connected In yet another aspect of the invention, a method for operating an STT MRAM device is provided. The method includes: providing a memory cell array that includes a plurality of cells having magnetic tunnel junctions in series with field effect transistors; a plurality of word lines perpendicular to a plurality of bit lines, wherein the field effect transistors are gated by the word lines, and wherein the bit lines are connected to the magnetic tunnel junctions; a plurality of source line segments spanning m+1 of the bit lines, wherein m of the bit lines include regular array bit lines, and wherein at least one other of the bit lines includes an extra bit line that is connected to the source line segments such that the source line segments span the regular array bit lines and the extra bit line; selecting a given one of the word lines; selecting a given one of the bit lines to select a given one of the cells at an intersection between the selected word line and the selected bit line; and passing a current along the selected bit line to the selected cell and, from the selected cell, along the extra bit line.

A more complete understanding of the present invention, as well as further features and advantages of the present invention, will be obtained by reference to the following detailed description and drawings.

BRIEF DESCRIPTION OF THE DRAWINGS

FIG. 7 is a diagram illustrating an exemplary apparatus for implementing the present techniques according to an embodiment of the present invention.

DETAILED DESCRIPTION OF PREFERRED EMBODIMENTS

Figure 1:
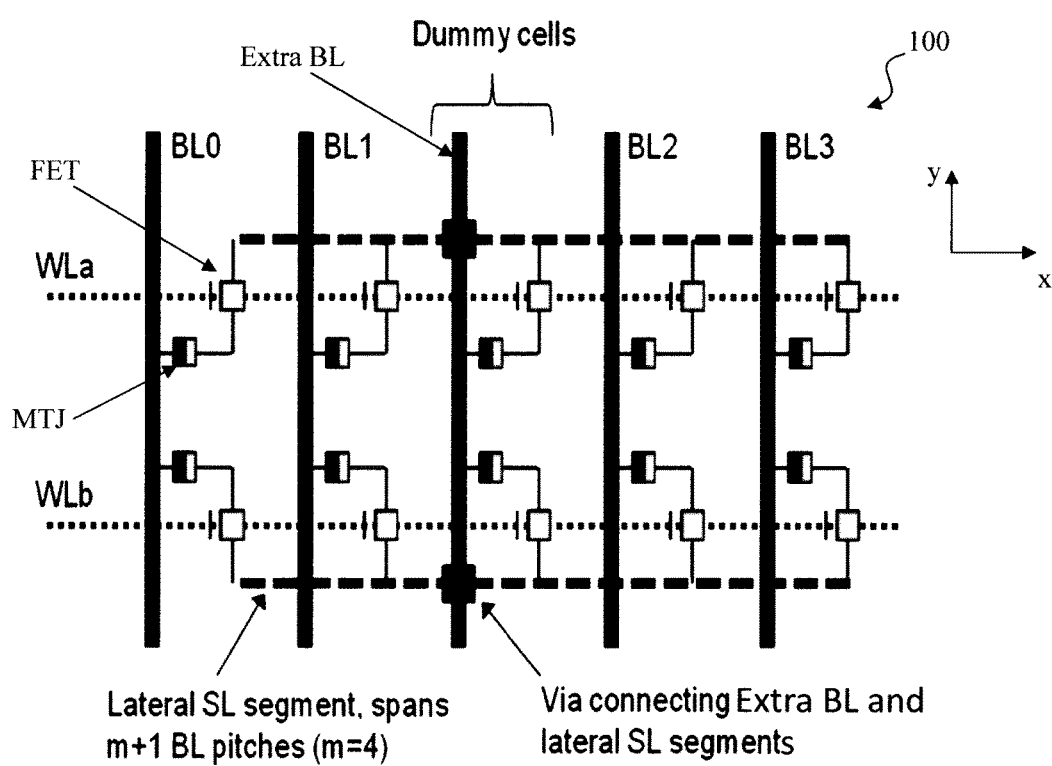
FIG. 1 is a schematic diagram of an array having an extra bit line (BL) connecting lateral source line (SL) segments together in the y-dimension according to an embodiment of the present invention.

Provided herein are improved Spin Torque Transfer (STT) Magnetoresistive Random Access Memory (MRAM) source line (SL) and SL driver circuit configurations. As will be described in detail below, techniques are provided which advantageously permit the SL to be run perpendicular with the bit line (BL). In that case, cells (i.e., magnetic tunnel junction (MTJ)+field effect transistor (FET)) share a common SL. However, to enable selectivity the SL is run vertically only over a certain number of the cells. The SL is accessed via an extra a extra BL that is shorted to the SL. An exemplary SL array biasing scheme that may be used in accordance with the present techniques is described, for example, in commonly owned U.S. patent application Ser. No. 15/251,518, entitled "Improved STT MRAM Common Source Line Array Bias Scheme," by DeBrosse, the contents of which are incorporated by reference as if fully set forth herein.

As provided above, during a write a voltage is forced across the cell from BL to SL, and the selected MTJ is written to a particular state depending on the polarity of this voltage (BL high vs. SL high). For instance, for MTJ with free layer on top of fixed layer BL high writes 0 or P state and vice versa, or the opposite for MTJs with the free layer on the bottom of the fixed layer).

When the cell is in the parallel or P state, the resistance (R) of the MTJ is lower than when in the anti-parallel or AP state. Representative values might be $R_P$=10KΩ and $R_{AP}$=20KΩ. The selected cell is read by sensing the resistance from BL to SL. The sensing or read voltage needs to be much lower than the write voltage to avoid disturbing the cell. The state-dependent change in resistance is characterized by the parameter magnetoresistance or MR, which is defined as $MR=(R_{AP}-R_P)/R_P$. For example, 100% is a typical nominal value for MR although higher values have been reported.

For read, the selected BL current is sensed while forcing the BL to Vread, perhaps 100 mV above the SL which is held to ground. The data cell current is typically compared to a reference current to determine the state of the cell. A common method of generating this reference current is through the use of reference cells, which have been preprogrammed to specific states and which are configured so as to produce a reference current roughly midway between the two nominal data state currents. This method provides excellent data to reference matching of many Process, Voltage, and Temperature (PVT) parameters. An exemplary reference cell layout that may be used in accordance with the present techniques is described, for example, in commonly owned U.S. patent application Ser. No. 15/251,466, entitled "STT MRAM Midpoint Reference Cell Allowing Full Write," by DeBrosse et al., the contents of which are incorporated by reference as if fully set forth herein.

Several approaches can been used to wire the SL within the array. As provided above, one approach is to wire the SL parallel to, and at the same pitch as, the BL. While this configuration provides excellent selectivity of a specific cell for write, it has the following notable disadvantage. Since the SL is connected to the FET, it is preferable to wire the SL on a metal level below the MTJ. Thus, the SL shares the cell area with a landing pad connecting the MTJ to the FET. This results in the SL being a narrow, highly resistive line or requires the cell to be larger than it would otherwise be.

Another technique for wiring the SL involves connecting all cell SL terminals together to a single net and biasing this net to a direct current (DC) voltage. See, for example, Kim et al., "A Covalent-Bonded Cross-Coupled Current-Mode Sense Amplifier for STT-MRAM with 1T1MTJ Common Source-Line Structure Array," 2015 IEEE International Solid-State Circuits Conference (ISSCC 2015), pgs. 134-136 (February 2015), the contents of which are incorporated by reference as if fully set forth herein. To write a voltage of V across the cell in both polarities, the BL must swing through a voltage range of 2 times V. Unfortunately, this technique is not compatible with the most advanced FET technologies, for which the reliable voltage range is quite limited. Also, the SL must still be wired in both dimensions throughout the array.

Yet another technique is to wire the SL parallel to the BL but at 2 times the BL pitch, effectively merging the SLs of two adjacent BLs. See, for example, U.S. Pat. No. 8,446,757 issued to DeBrosse et al., entitled "Spin-Torque Transfer. Magneto-Resistive Memory Architecture," the contents of which are incorporated by reference as if fully set forth herein. This somewhat, but not entirely, relieves the SL resistance and cell area concerns (see above). Also, there is a disturb concern with this approach, as the MTJ adjacent to a write-selected MTJ (sharing the same WL & SL, but on the adjacent BL) will experience a disturb voltage roughly equal to the IR drop along the SL for the entire duration of the write pulse.

While it is quite simple to connect the cell SL terminals in the X dimension (defined herein as being parallel to the WL), it is much more difficult from the cell layout perspective to connect the SL terminals in the Y dimension (defined herein as being parallel to BL). Still yet another approach is to connect the cell SL terminals across a span of m BLs in the X dimension, wherein the SLs are not connected in the Y dimension (beyond the sharing of cell SL connections between cells corresponding to pairs of adjacent WLs). See, for example, U.S. Pat. No. 8,355,272 issued to Andre, entitled "Memory Array Having Local Source Lines," the contents of which are incorporated by reference as if fully set forth herein. When a WL is selected, the m−1 half-selected cells (same SL & WL, different BL) provide the SL bias to the selected cell. The unselected BLs and half-selected cells effectively provide the SL bias. These half-selected cells experience a disturb voltage of approximately V/(m−1), where V is the cell write voltage, for the entire duration of the write pulse.

To expand on this concept, an additional "assist bit line" can be included for every group of m bit lines. See, for example, U.S. Patent Application Publication Number 2015/0255133 by Andre, entitled "Assisted Local Source Line," the contents of which are incorporated by reference as if fully set forth herein. The "assist bits" along this line resemble normal data bits except that the MTJ resistance is reduced by one of several methods. This shunt in parallel with the m−1 half-selected bits reduces the disturb voltage experienced by the m−1 half-selected bits. Nonetheless, a small disturb voltage is still experienced by the m−1 half-selected bits for the entire duration of the write pulse.

To address these drawbacks, the present SL configuration employs an extra BL (that runs along the y-dimension) that connects lateral SL segments (which run along the x-dimension) together in the y-dimension. See, for example, the data cell array of FIG. 1.

As shown in the array schematic diagram 100 of FIG. 1, each STT MRAM memory cell in the array includes an MTJ in series with a FET which is gated by a WL (i.e., WLa, WLb, etc.). A BL (i.e., BL0, BL1, etc.) is connected to the MTJ and runs perpendicular to the WL. Lateral SL segments, which are connected to the FET, span m+1 BL pitches. According to an exemplary embodiment, m=4, 8, 16 or 32. Thus, using the example shown in FIG. 1, two SL segments are shown, one at the top of the array, and one at the bottom of the array. Four regular array BLs are present (i.e., m=4) in this example. They are BL0, BL1, BL2, and BL4. Each SL segment spans these four regular array BLs plus an extra "dummy" BL (see below) (i.e., m+1). It is this extra BL that interconnects the two SL segments.

Specifically, as shown in FIG. 1, for every group of m BLs (e.g., m=4), there is an extra BL (labeled "extra BL") which is physically identical to the regular array BLs (i.e., BL0, BL1, etc.) except that this extra BL is connected by vias to the lateral SL segments, which extend in the X dimension for m+1 BL pitches. The extra BL is part of a line of dummy cells. By "dummy" it is meant that, unlike the regular array BLs (i.e., BL0, BL1, etc.), this extra/dummy BL is simply shorted to the SL segments. To form the extra BL, a BL and associated MTJs+FETs is patterned along with the regular array BLs and cells. However, unlike the regular array BLs, vias are then formed shorting the extra BL to the SL segments. Thus, the extra BL serves as a vertical SL (that runs along the y-dimension).

Figure 2:
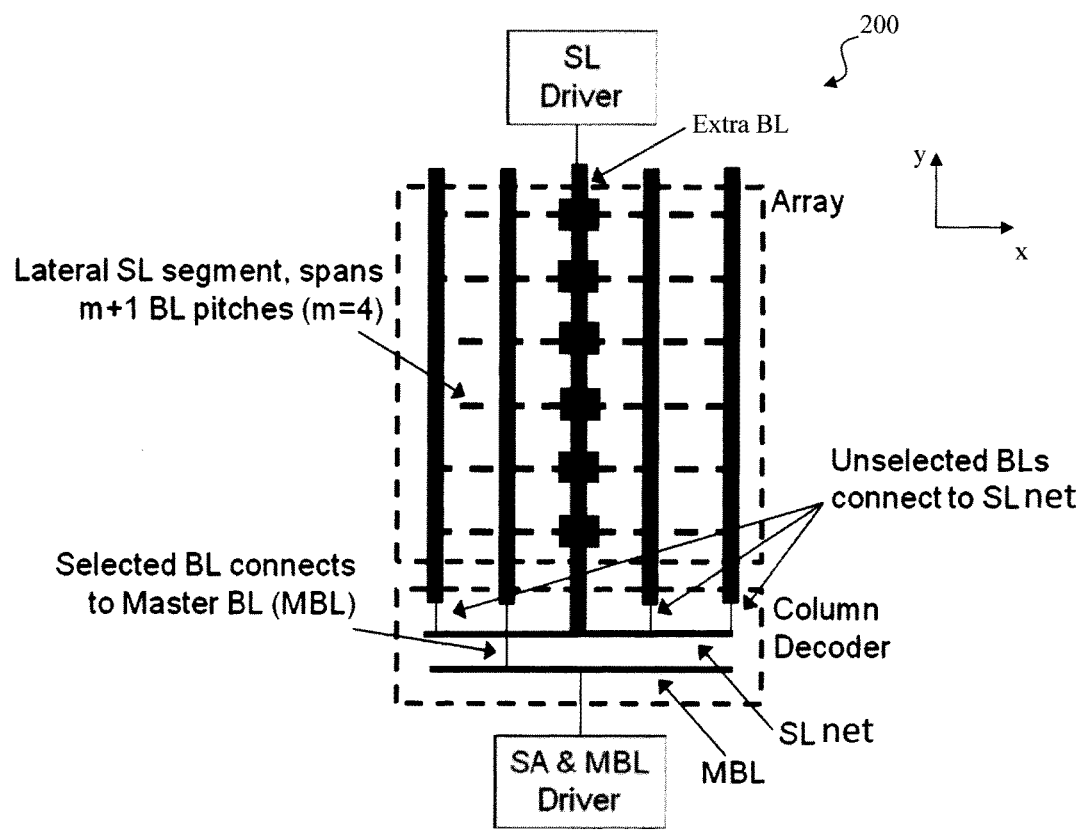
FIG. 2 is a schematic diagram illustrating placement of the SL, column decoder, SL driver, sense amplifier (SA), and master bit line (MBL) driver according to an embodiment of the present invention.

FIG. 2 is a schematic diagram 200 illustrating placement of a column decoder, SL driver, sense amplifier (SA), and master bit line (MBL) driver relative to the array of FIG. 1. The column decoder simply determines which BL in the array (arranged in columns along the y-dimension) to select, and connects the selected BL to a master BL (MBL). The column decoder includes FET switches (not individually shown) that select the given BL. The column decoder switches are located at one end of the BL (i.e., at the top or, as shown in FIG. 2, at the bottom). The column decoder connects the unselected m−1 BLs to an SL net. The MBL is controlled by Sense Amplifier (SA) and MBL Driver circuits. For instance, in read, a small voltage, Vread is forced on the MBL and the resulting current is sensed. In Write0, the MBL is driven high and low for Wr1 (free layer on top scenario—see above). The MBL is typically grounded in standby. The SL driver drives the SL to ground except in the case of writing 1, when the SL is driven high (free layer on top scenario—see above). As will be described in detail below, the SA determines the output state of the data cell array by comparing the current output from the data cell array with the current from a midpoint reference cell array.

The SL driver circuit is connected to and controls the extra BL. As shown in FIG. 2, the SL Driver circuit is located at an opposite end of the BLs from the column decoder. Driving the MBL and hence the BL) from one end and the SL from the opposite end ensures that the current path (in read or write) includes exactly one length of the array on the BL wiring. This greatly improves read and write uniformity with respect to WL address. Otherwise, the current path is out to the cell and back which is very dependent on WL address. The parasitic wiring resistance (R) in the array is always 1*Rbl as opposed to 0 to 2*Rbl.

Figure 3:
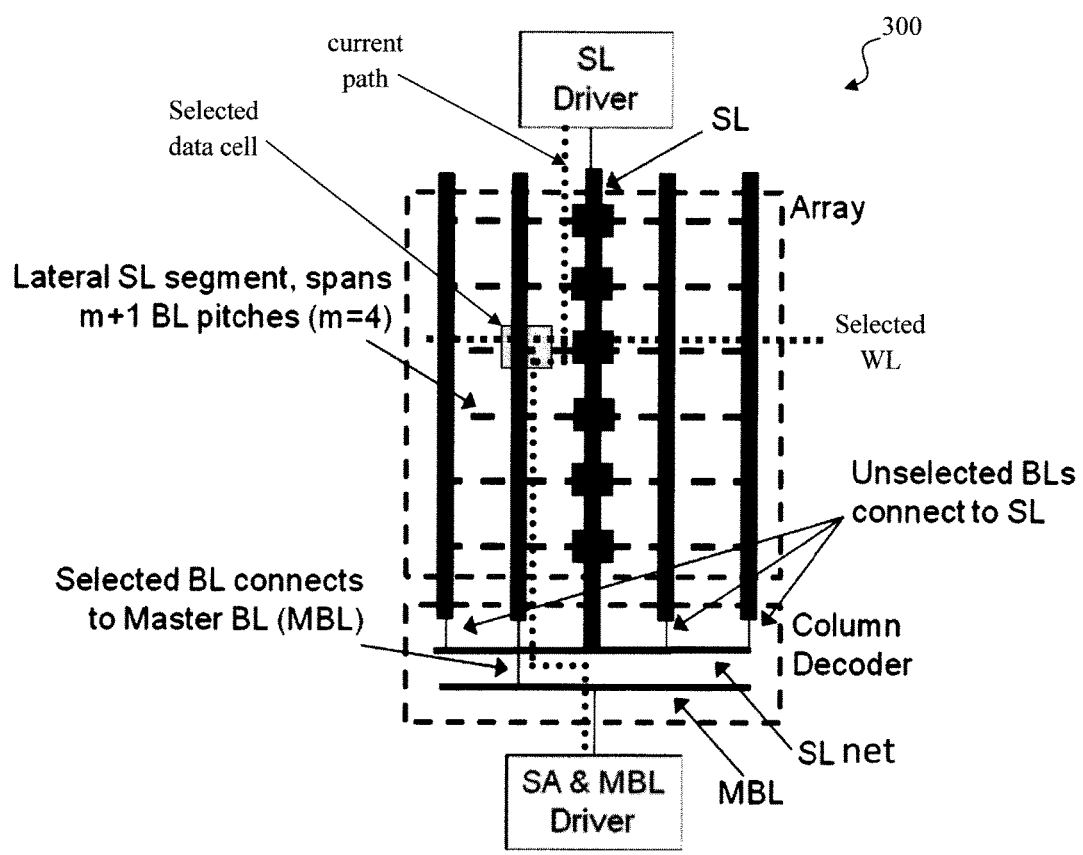
FIG. 3 is a schematic diagram illustrating a current path from SA and MBL driver to SL driver according to an embodiment of the present invention.

FIG. 3 is a schematic diagram 300 illustrating the current path from the SA and MBL Driver circuits along the BL to the selected cell and from there along the extra BL to the SL Driver. Because the extra BL is identical to the regular array BLs (except for the additional vias to the SL segments—which do not affect its resistance) the total of the selected BL and extra BL wiring resistance along this path is independent of the selected row or WL address.

This fact is very advantageous for both writing and reading the memory. For writing of either state (parallel (P) or anti-parallel (AP)), the voltage applied to the MTJ is much more uniform as the series wiring resistance is independent of the selected row or WL address.

For sensing, the series wiring resistance is also independent of the selected row or WL address, which eliminates the need to match the distance of the reference cells to the SA to that of the selected data cell. This greatly reduces the number of reference cells, which in turn has several advantages. Fewer reference cells and their corresponding peripheral circuitry results in area savings. Also, fewer reference cells reduces the significance of the reference cell resistance distribution as a signal margin detractor.

Figure 4:
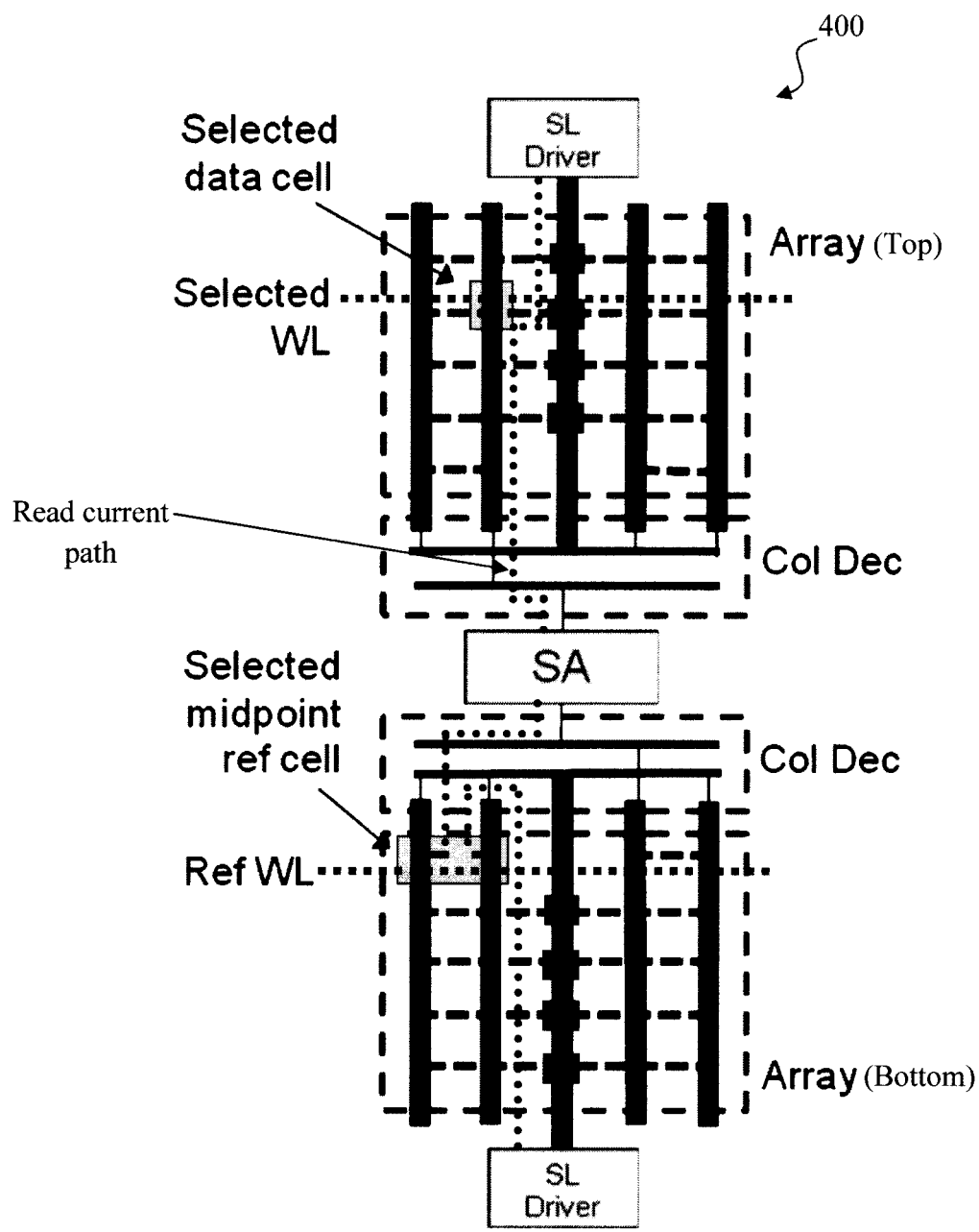
FIG. 4 is a schematic diagram illustrating a read current path for the data cell and for a midpoint reference cell according to an embodiment of the present invention.

By way of example only, FIG. 4 is a schematic diagram 400 illustrating the read current path for a data cell (in the top array in this example) and a midpoint reference cell (in the bottom array in this example). In this example, the SA services both arrays, one being above and the other being below the SA. The SA is configured as described in U.S. Pat. No. 9,343,131 issued to DeBrosse, entitled "Mismatch and Noise Insensitive Sense Amplifier Circuit for STT MRAM," the contents of which are incorporated by reference as if fully set forth herein. Each of these arrays is configured, as described above, to have multiple, lateral SL segments connected in the y-dimension by an extra BL. A single reference WL is implemented in each of the two arrays, each immediately adjacent to the Column Decoder. In this particular example, the reference WL (Ref WL) is shown in the bottom array, and corresponds to a selected midpoint reference cell. The data WL (selected WL) is shown in the top array, and corresponds to a selected data cell. However, since identical, either the top or bottom array can serve as the data or reference cell.

When (as illustrated in FIG. 4) a WL is selected in the upper array for read (selected WL), the reference WL (Ref WL) of the lower array is also selected, and vice versa. Since the two (top and bottom) arrays have independent column decoders, the column address corresponding to the best reference cell (in fact the best set of reference cells since many SAs will be arranged horizontally) can be selected independently of the column address of the data cell.

For this example, as few as two reference cells (e.g., 1 upper, 1 lower) service the entire domain of the SA. If SA trimming is employed to eliminate SA offset or to center the reference, and if two values of SA trim value are stored per SA (1 upper, 1 lower), then any reference cell variation may be completely trimmed out (to the resolution of the trimming). This effectively eliminates the reference cell distribution as a signal detractor.

Figure 5:
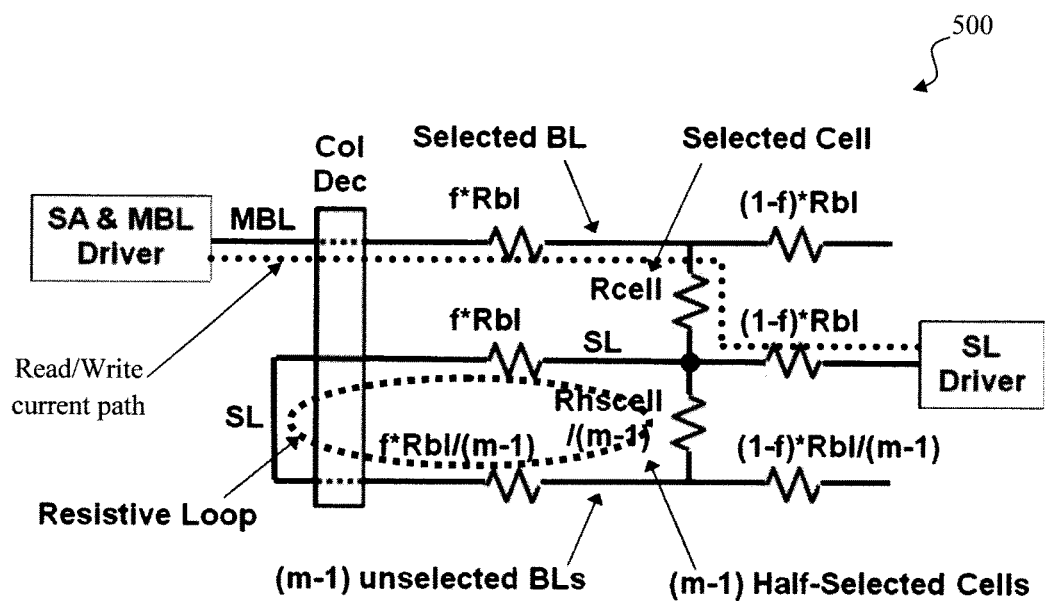
FIG. 5 is a circuit diagram of the array illustrating that there is no sustained disturb voltage on the half-selected cells according to an embodiment of the present invention.

FIG. 5 is a diagram 500 of an equivalent circuit of the present array (e.g., either the top or bottom array of FIG. 4) illustrating the elimination of any sustained disturb voltage on half-selected cells. In FIG. 5, f represents the distance of the selected WL from the column decoder as a fraction of the BL length. Hence the BL and SL are each represented by two resistors f*Rbl and (1−f)*Rbl where Rbl is the resistance of the entire BL length. The selected cell (MTJ and FET) are represented by a single resistor Rcell.

The m−1 unselected BLs are condensed in parallel to two resistors f*Rbl/(m−1) and (1−f)*Rbl/(m−1). Similarly, the m−1 half-selected cells are condensed in parallel into Rhscell/(m−1).

The write or read current path from SA and MBL driver to SL Driver is shown. Due to the placement of the SL Driver at the far end of the array and the connection of the unselected BLs to the SL (both important components of the present techniques) there is no sustained disturb voltage across the half-selected cells represented by Rhsel/(m−1).

This can be easily seen by noting the resistive loop indicated with a dotted circle, and observing that no sustained current flows in any portion of this loop. Hence the sustained voltage across any component of this loop, including Rhsel/(m−1) must be exactly zero.

That said, small transient disturbs may result from charging and discharging the various BL and SL capacitances (not shown). However, these can be almost entirely eliminated by proper timing of the WL, BL and SL pulses. Specifically, the BL and SL should be moved to and from their target Write voltages only when the WL is low.

Figure 6:
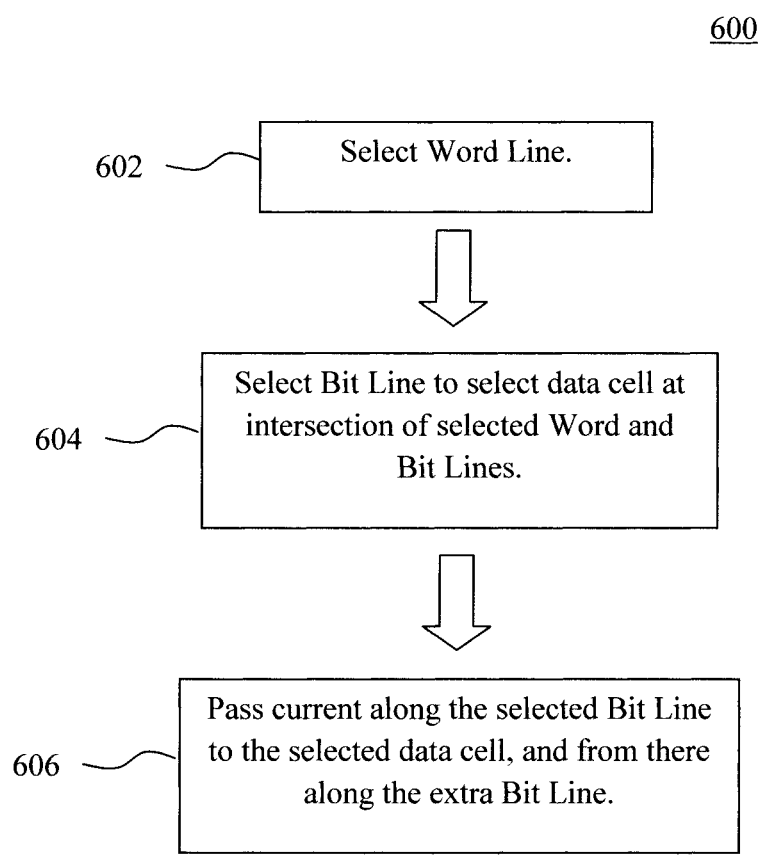
FIG. 6 is a diagram illustrating an exemplary methodology for operating an STT MRAM device according to an embodiment of the present invention.

An exemplary methodology 600 for operating the present STT MRAM array is now described by way of reference to FIG. 6. For illustrative purposes only, methodology 600 will be described in conjunction with the schematic shown in FIG. 3. In step 602, a given WL is selected. In FIG. 3, the selected WL is labeled and highlighted with a dashed line.

In step 604, a given BL is selected. This will select one data cell along the selected WL. Specifically, the selected data cell will be that cell at the intersection between the selected WL and the selected BL. The bit line selection in step 604 is performed using the column decoder. As described above, the column decoder contains FET switches that connect the current source (in this case the SA & MBL Driver circuit) to a particular column/BL in the array. As also described above, the column decoder connects the selected BL to the MBL which in turn is connected to the SA & MBL Driver circuit. The column decoder also connects the unselected BLs to the extra BL.

Next, in step 606, a read/write current is passed along the selected BL to the selected data cell and from the selected data cell along the extra BL. The SA & MBL Driver circuit generates this current which makes its way along this path to the SL driver.

Turning now to FIG. 7, a block diagram is shown of an apparatus 700 in which the present techniques may be implemented and/or which may be used for implementing one or more of the methodologies presented herein. By way of example only, apparatus 700 can be configured to implement one or more of the steps of methodology 600 of FIG. 6.

Apparatus 700 includes a computer system 710 and removable media 750. Computer system 710 includes a processor device 720, a network interface 725, a memory 730, a media interface 735 and an optional display 740. Network interface 725 allows computer system 710 to connect to a network, while media interface 735 allows computer system 710 to interact with media, such as a hard drive or removable media 750.

Processor device 720 can be configured to implement the methods, steps, and functions disclosed herein. The memory 730 could be distributed or local and the processor device 720 could be distributed or singular. The memory 730 could be implemented as an electrical, magnetic or optical memory, or any combination of these or other types of storage devices. Moreover, the term "memory" should be construed broadly enough to encompass any information able to be read from, or written to, an address in the addressable space accessed by processor device 720. With this definition, information on a network, accessible through network interface 725, is still within memory 730 because the processor device 720 can retrieve the information from the network. It should be noted that each distributed processor that makes up processor device 720 generally contains its own addressable memory space. It should also be noted that some or all of computer system 710 can be incorporated into an application-specific or general-use integrated circuit.

Optional display 740 is any type of display suitable for interacting with a human user of apparatus 700. Generally, display 740 is a computer monitor or other similar display.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A Spin Torque Transfer (STT) Magnetoresistive Random Access Memory (MRAM) array, comprising:
   a plurality of cells comprising magnetic tunnel junctions in series with field effect transistors;
   a plurality of word lines perpendicular to a plurality of bit lines, wherein the field effect transistors are gated by the word lines, and wherein the bit lines are connected to the magnetic tunnel junctions; and
   a plurality of source line segments perpendicular to the bit lines and spanning m+1 of the bit lines, wherein m of the bit lines comprise regular array bit lines, and wherein at least one other of the bit lines comprises an extra bit line that is shorted to the source line segments such that the source line segments span the regular array bit lines and the extra bit line.

2. The STT MRAM array of claim 1, wherein m=4, 8, 16 or 32.

3. The STT MRAM array of claim 1, further comprising:
   vias connecting the extra bit line to the source line segments, wherein the vias short the extra bit line to the source line segments such that the extra bit line serves as a vertical source line that is perpendicular to the source line segments.

4. The STT MRAM array of claim 1, wherein the regular array bit lines and the extra bit line are physically identical.

5. The STT MRAM array of claim 1, further comprising:
   a first source line segment at a top of the STT MRAM array; and
   a second source line segment at a bottom of the STT MRAM array.

6. An STT MRAM device, comprising:
   a memory cell array comprising:
      a plurality of cells comprising magnetic tunnel junctions in series with field effect transistors;
      a plurality of word lines perpendicular to a plurality of bit lines, wherein the field effect transistors are gated by the word lines, and wherein the bit lines are connected to the magnetic tunnel junctions;
      a plurality of source line segments perpendicular to the bit lines and spanning m+1 of the bit lines, wherein m of the bit lines comprise regular array bit lines, and wherein at least one other of the bit lines comprises an extra bit line that is shorted to the source line segments such that the source line segments span the regular array bit lines and the extra bit line;
   a source line driver on one end of the bit lines connected to the extra bit line; and
   a column decoder on an opposite end of the bit lines from the source line driver, wherein the column decoder further comprises: a source line net to which all unselected bit lines are connected; and a master bit line to which a selected one of the bit lines is connected.

7. The STT MRAM device of claim 6, wherein m=4, 8, 16 or 32.

8. The STT MRAM device of claim 6, further comprising:
   vias connecting the extra bit line to the source line segments, wherein the vias short the extra bit line to the source line segments such that the extra bit line serves as a vertical source line that is perpendicular to the source line segments.

9. The STT MRAM device of claim 6, further comprising:
   a first source line segment at a top of the STT MRAM array; and a second source line segment at a bottom of the STT MRAM array.

10. The STT MRAM device of claim 6, further comprising:

a sense amplifier for controlling the master bit line.

11. A method for operating an STT MRAM device, the method comprising:

providing a memory cell array comprising:

a plurality of cells comprising magnetic tunnel junctions in series with field effect transistors;

a plurality of word lines perpendicular to a plurality of bit lines, wherein the field effect transistors are gated by the word lines, and wherein the bit lines are connected to the magnetic tunnel junctions;

a plurality of source line segments perpendicular to the bit lines and spanning m+1 of the bit lines, wherein m of the bit lines comprise regular array bit lines, and wherein at least one other of the bit lines comprises an extra bit line that is shorted to the source line segments such that the source line segments span the regular array bit lines and the extra bit line;

selecting a given one of the word lines;

selecting a given one of the bit lines to select a given one of the cells at an intersection between the selected word line and the selected bit line; and passing a current along the selected bit line to the selected cell and, from the selected cell, along the extra bit line.

12. The method of claim 11, further comprising:

connecting unselected bit lines to the extra bit line.

13. The method of claim 11, wherein the bit line is selected using a column decoder.

14. The method of claim 11, wherein m=4, 8, 16 or 32.

15. The method of claim 11, wherein the memory cell array further comprises:

vias connecting the extra bit line to the source line segments, wherein the vias short the extra bit line to the source line segments such that the extra bit line serves as a vertical source line that is perpendicular to the source line segments.

16. The method of claim 11, wherein the memory cell array further comprises:

a first source line segment at a top of the STT MRAM array; and a second source line segment at a bottom of the STT MRAM array.

* * * * *